(12) United States Patent
Parker et al.

(10) Patent No.: US 9,153,324 B2
(45) Date of Patent: Oct. 6, 2015

(54) PATTERN BREAKING IN MULTI-DIE WRITE MANAGEMENT

(71) Applicant: SanDisk Technologies Inc., Plano, TX (US)

(72) Inventors: Liam Michael Parker, Edinburgh (GB); Sergey Gorobets, Edinburgh (GB); Alan Bennett, Edinburgh (GB); Leena Patel, Edinburgh (GB)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 14/289,917

(22) Filed: May 29, 2014

(65) Prior Publication Data

US 2015/0213893 A1       Jul. 30, 2015

Related U.S. Application Data (63) Continuation of application No. 14/153,480, filed on Jan. 30, 2014.

(51) Int. Cl.
*G11C 16/12* (2006.01)
*G11C 16/08* (2006.01)
*G06F 12/02* (2006.01)

(52) U.S. Cl.
CPC .............. *G11C 16/08* (2013.01); *G11C 16/12* (2013.01); *G06F 12/0207* (2013.01)

(58) Field of Classification Search
CPC ............ G06F 11/1415; G06F 12/0246; G06F 12/0207; G06F 15/7867; G11C 16/08; G11C 16/12
USPC .................. 711/103, 141, 202, E12.003, 110, 711/E12.001, E12.002, E12.008, E12.103, 711/1, 100, 101, 154, 173, 2, 209, 4, 167, 711/217, 218; 712/E9.043; 714/763; 365/230.03, 230.04

See application file for complete search history.

(56) References Cited

U.S. PATENT DOCUMENTS

| | | |
|---|---|---|
| 5,570,315 A | 10/1996 | Tanaka et al. |
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |

(Continued)

FOREIGN PATENT DOCUMENTS

| | | |
|---|---|---|
| EP | 2367175 A2 | 9/2011 |
| WO | 200907210 A2 | 11/2009 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Tuan Thai
*Assistant Examiner* — Edward Waddy, Jr.
(74) *Attorney, Agent, or Firm* — Davis Wright Tremaine LLP (57) ABSTRACT

A die assignment scheme assigns data, in the order it is received, to multiple memory dies with some randomness. Randomization events, such as skipping dies or reversing direction, occur at intervals, with a deterministic assignment scheme used between randomization events. Intervals between randomization events may be of random length, or of fixed length.

21 Claims, 10 Drawing Sheets

(56) References Cited

U.S. PATENT DOCUMENTS

| | | | |
|---|---|---|---|
| 6,320,812 B1* | 11/2001 | Cook et al. | 365/230.03 |
| 7,951,669 B2 | 5/2011 | Harari et al. | |
| 8,095,577 B1* | 1/2012 | Faibish et al. | 707/823 |
| 2011/0153911 A1* | 6/2011 | Sprouse et al. | 711/103 |
| 2012/0155173 A1* | 6/2012 | Lee et al. | 365/185.09 |
| 2013/0107628 A1 | 5/2013 | Dong et al. | |
| 2013/0220088 A1 | 8/2013 | Horn et al. | |
| 2013/0265838 A1* | 10/2013 | Li | 365/194 |
| 2013/0336039 A1* | 12/2013 | Frans | 365/51 |
| 2014/0156911 A1* | 6/2014 | Alcantara et al. | 711/103 |
| 2014/0189210 A1* | 7/2014 | Sinclair et al. | 711/103 |
| 2014/0208004 A1* | 7/2014 | Cohen et al. | 711/103 |

OTHER PUBLICATIONS

U.S. Appl. No. 14/094,550 entitled "Multi-Die Write Management," filed Dec. 2, 2013, _pages.

International Search Report and Written Opinion of the International Searching Authority issued for International Application No. PCT/US2014/012295 mailed on Apr. 10, 2015, 10 pages.

* cited by examiner

FIG. 2B (PRIOR ART)
(Section A-A)

PATTERN BREAKING IN MULTI-DIE WRITE MANAGEMENT

CROSS-RELATED APPLICATION

This application is a continuation of U.S. application Ser. No. 14/153,480 filed Jan. 30, 2014, which application is incorporated herein in its entirety by this reference.

BACKGROUND OF THE INVENTION

This invention relates generally to non-volatile semiconductor memories, their operation and, in particular, to the operation of memory systems that include multiple dies.

Figure 1:
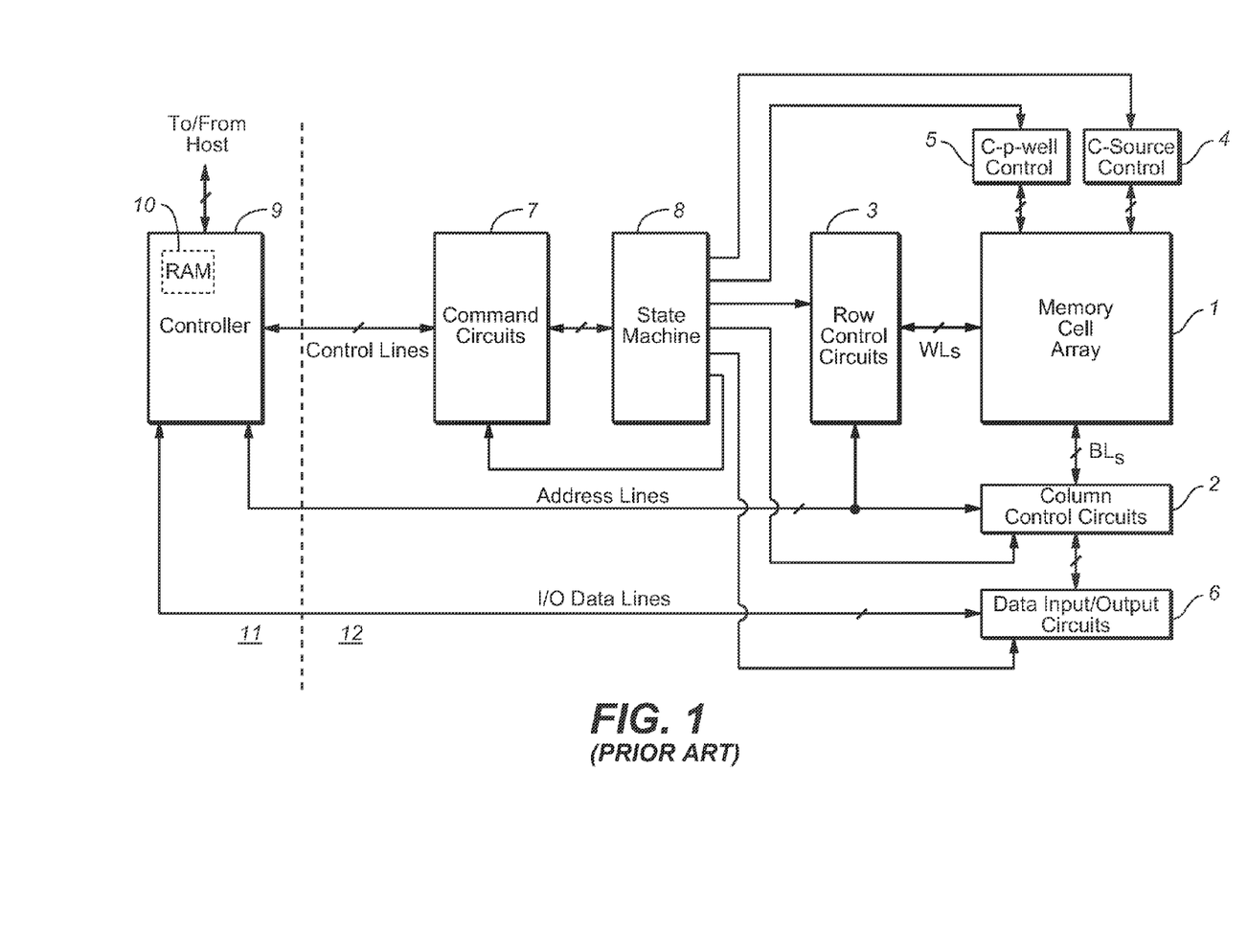
FIG. 1 is a block diagram of a prior art memory system.

There are many commercially successful non-volatile memory products available today, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

Figure 2A:
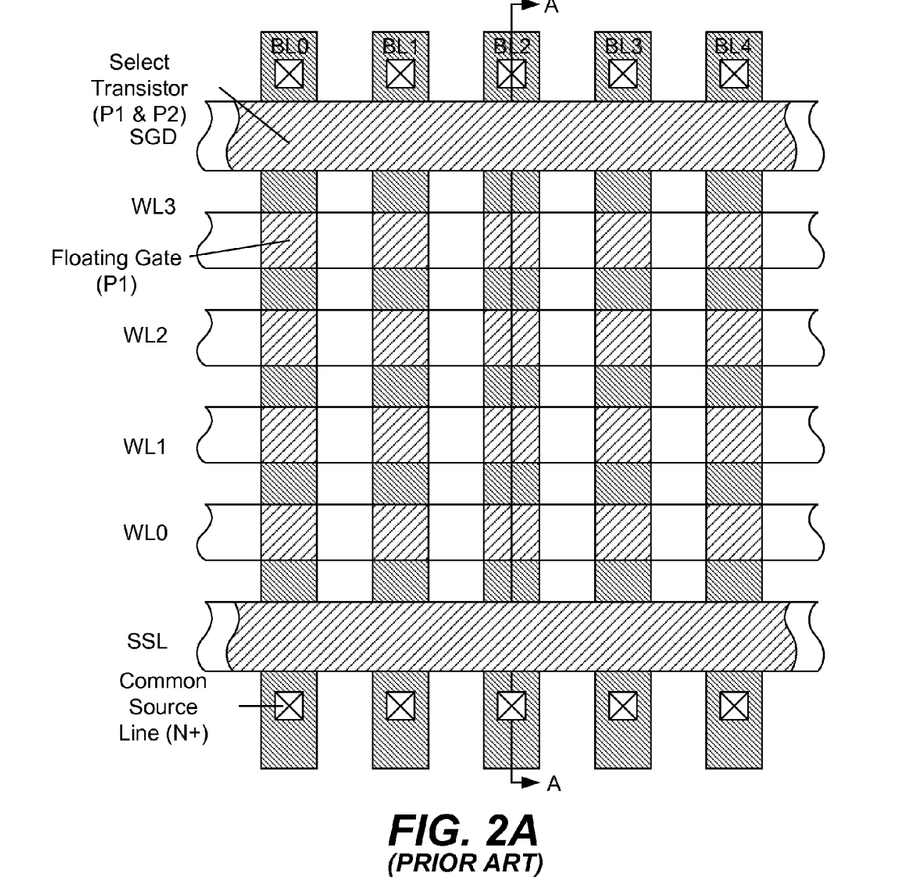
FIG. 2A is a plan view of a prior art NAND array.
Figure 2B:
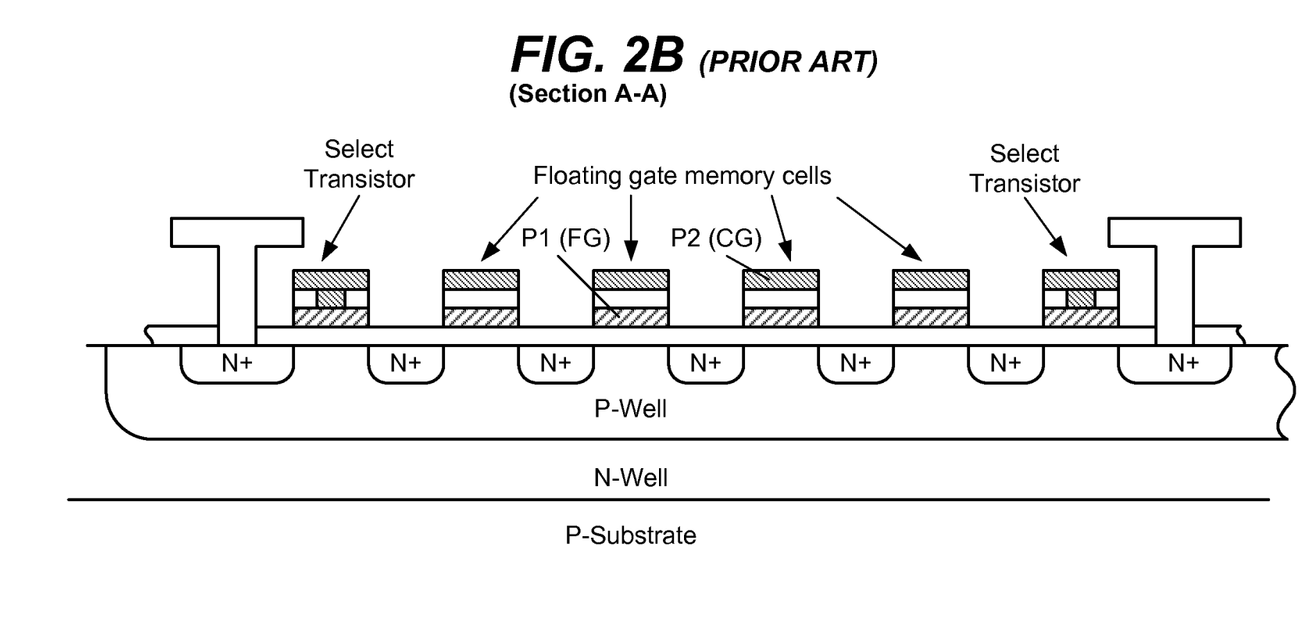
FIG. 2B is a cross-sectional view of the prior art NAND array of FIG. 2A taken along the line A-A.

One popular flash EEPROM architecture utilizes a NAND array, wherein a large number of strings of memory cells are connected through one or more select transistors between individual bit lines and a reference potential. FIGS. 2A-2B illustrate an example of a planar NAND flash memory array. In other examples, NAND strings extend in a vertical direction in what may be referred to as three dimensional (3D) memory.

Figure 3A:
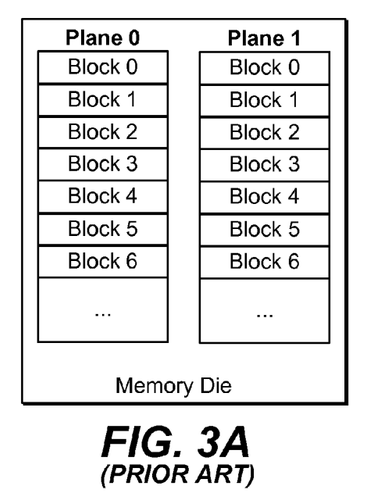
FIG. 3A shows blocks of memory cells arranged in two planes of a memory die.

Flash memory is generally arranged in blocks, with a block being the unit of erase. FIG. 3A illustrates blocks in a memory die that are arranged in two planes. Blocks in a plane share certain circuits so that only one block in a plane is accessed at a time. Multiple planes allow multiple blocks in a die to be accessed in parallel.

Figure 3B:
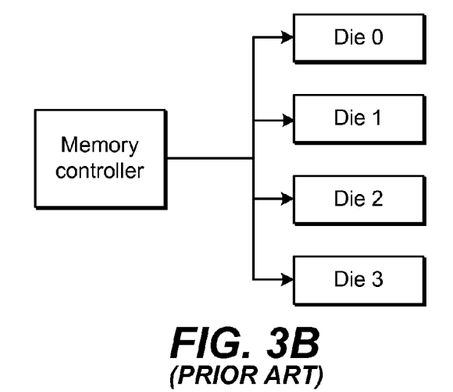
FIG. 3B shows four dies that are connected by a memory bus to a memory controller.

Multiple dies may be connected to a memory controller by a memory bus as shown in FIG. 3B. The memory controller receives data and distributes it to the dies. While such an arrangement may allow a high degree of parallelism in some conditions, delays may occur when one or more dies become busy and thus may affect write speed.

SUMMARY OF THE INVENTION

A die assignment scheme that is implemented by a memory controller assigns data, in the order it is received, to multiple memory dies that are connected to the memory controller (e.g. by a shared memory bus) with some pattern-breaking (e.g. randomization) to disrupt alignment of host data patterns to dies. Randomization may be introduced by randomization events such as skipping one or more dies, or reversing order (direction) of assignment. Skipping of dies may be implemented by using a slow write mode that causes one or more dies to remain busy for longer than normal and thus causes them to be skipped. Randomization events may be introduced at an appropriate frequency to ensure adequate pattern breaking, while maintaining adequate write performance.

An example of a method of operating a plurality of nonvolatile memory dies in a nonvolatile memory system includes: sending a plurality of portions of data to a plurality of memory dies; assigning portions of data to individual memory dies according to a first assignment scheme that assigns portions of data to dies in a deterministic manner; and assigning at least one of the plurality of portions of data to an individual memory die according to a second assignment scheme that assigns the at least one of the plurality of portions in a pattern-breaking manner that is contrary to the first assignment scheme, disrupting alignment of data to dies according to the first assignment scheme.

The pattern-breaking manner may be a random manner. The first assignment scheme may assign individual portions of data to individual memory dies in a cyclical pattern, and assignment in the pattern-breaking manner may include skipping the next ready die in the cyclical pattern. The first assignment scheme may assign individual portions of data to individual memory dies in a cyclical pattern, skipping busy dies, and assignment in the random manner may include increasing programming time of a randomly selected die so that the randomly selected die remains busy for an extended period during which the randomly selected die is skipped. The first assignment scheme may assign individual portions of data to individual memory dies in a cyclical pattern, and assignment in the random manner may include reversing direction of the cyclical pattern at random. The first assignment scheme may assign individual portions of data to individual memory dies in a cyclical pattern, and assignment in the random manner may include starting a cycle of the cyclical pattern at a randomly selected die. The cyclical pattern may continue from the randomly selected die for a random number of dies after which another cycle is started at a randomly selected die. Assigning the at least one of the plurality of portions of data to the memory die in the pattern-breaking manner may provide slower write speed than assigning in a non-random pattern.

An example of a method of operating a nonvolatile memory system includes: sending units of data from a memory controller, over a memory bus that connects the memory controller to a plurality of memory dies, in a cyclic addressing pattern, until a memory die that is next in the cyclic addressing pattern to a last addressed memory die is busy, or pattern-breaking is triggered; in response to determining that the memory die that is next in the cyclic addressing pattern to the last addressed memory die is busy, skipping the memory die that is next in the cyclic addressing pattern and addressing a subsequent memory die in the cyclic addressing pattern that is ready; and in response to pattern-breaking being triggered, addressing a memory die that is selected from a plurality of candidate memory dies that does not include the next memory die in the cyclic addressing pattern.

The last addressed memory die may be excluded from the plurality of candidate memory dies for random selection. One or more busy memory dies may be included in the plurality of candidate memory dies for random selection. The inclusion of the one or more busy memory dies may be in response to a determination that delay from waiting for the one or more busy memory dies to be ready is within a predetermined limit. Pattern-breaking may be triggered by a determination that there is a high risk of an undesirable data pattern being established in one or more of the plurality of memory dies.

An example of a nonvolatile memory system includes: a plurality of nonvolatile memory dies; a memory controller; a data assignment circuit in the memory controller that is configured to assign units of data for storage in the plurality of memory dies in a deterministic manner; and a pattern-breaking circuit in the memory controller that is configured to disrupt alignment of data to memory dies. A random number generator may generate a random input to the pattern-breaking circuit. A programming circuit may have a normal programming mode and a slow programming mode, the random input provided to the programming circuit to randomly identify a memory die for programming in a slow programming mode. The nonvolatile memory dies may be NAND flash memory dies. The plurality of nonvolatile memory dies may consist of four dies. A memory bus may connect the plurality of nonvolatile memory dies to the memory controller.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

DETAILED DESCRIPTION OF EXEMPLARY EMBODIMENTS

Memory System

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

A portion of a memory array that may be used as array 1 is shown in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In addition to planar (two dimensional) memory arrays as described above, three dimensional memory arrays are formed with multiple layers of memory cells stacked above each other on a substrate. Examples of such three dimensional memory arrays, their formation, and their operation are described in U.S. Patent Publication Number 2012/0220088 and in U.S. Patent Publication Number 2013/0107628, which are hereby incorporated by reference in their entirety.

In many nonvolatile memory arrays (including both planar and 3-D memories), memory cells are erased in relatively large units that are referred to as blocks. Blocks may be arranged in planes, with all blocks of a plane sharing a set of bit lines and sharing certain memory access circuits such as sense amplifiers and data latches that are used to program and read memory cells in the plane. Two or more planes may be located on the same die.

FIG. 3A shows an example of a die that has two planes, Plane 0 and Plane 1, each containing multiple blocks. FIG. 3B shows how memory dies may be configured within a multi-die memory system. FIG. 3B shows a memory controller in communication with multiple memory dies over a memory bus. In general, such a multi-die arrangement may be used to write and read data rapidly by operating dies in parallel. Data that is received from a host may be sent by the memory controller to the memory dies which initially store the data in data latches and then program the data into memory cells. While the memory bus may only allow data to be sent to one die at a time, data transfer time is relatively short compared with the time to program the data to memory cells of the die so that while data is being sent to one die other dies may be programming data. In some cases, a memory controller may control multiple memory busses, each with multiple memory dies (e.g. two busses with two dies each). In other cases, memory dies may have dedicated communication channels instead of a shared memory bus (e.g. four dies, each with separate communication channel to controller). The number of dies in any of these arrangements is not limited to four but may be any suitable number.

Figure 4:
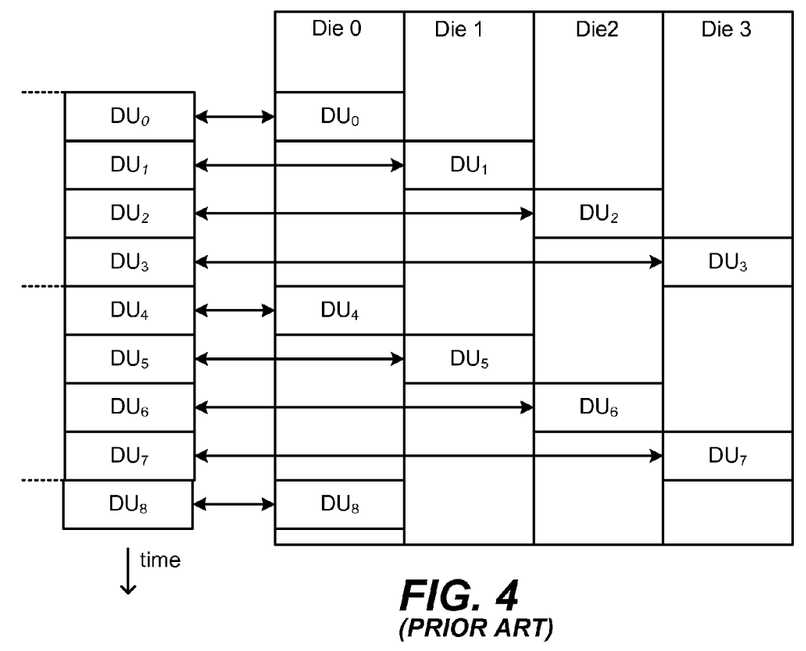
FIG. 4 shows assignment of host data to four dies according to a predetermined pattern.

FIG. 4 shows an example of a scheme for assigning data to memory dies. Data that is received from a host may be divided into data units ("DU") for transfer to the memory dies (die 0-die 3). In the present example, data received from the host is simply divided into equal sized data units in the order it was received, with each data unit being equal in size to the amount of data that can be programmed in a die in one programming operation (one page where the die includes one plane, two pages where the die includes two pages, etc.). Data units are numbered in order in which they are received $DU_0$, $DU_1$, $DU_2$, and so on. It will be understood that the numbering reflects the order in which the data was received and does not necessarily reflect any order assigned by the host. Data that is received from the host may be logically sequential or nonsequential. In either case it may be divided into data units in the order in which it was received and assigned to dies as shown. Data is striped across all dies so that writing is performed with high parallelism. FIG. 4 shows time along the vertical axis with $DU_0$ being received and stored first, then $DU_1$, and so on.

Data units are assigned to dies in a cyclic order in FIG. 4. The cyclic order starts with die 0, then die 1, die 2, die 3, and then back to die 0 where the cycle repeats. This assignment scheme is simple to implement. In some cases, blocks of different dies are linked to form metablocks so that a group of data units are assigned to a metapage within a metablock. Linking of blocks to form metablocks may be static so that the same blocks remain linked throughout the lifecycle of the product, or may be a more flexible dynamic linking, with different blocks linked at different times. In either case, the same blocks remain linked between successive erase operations and pages within the blocks are programmed together as a metapage. Thus, where the example of FIG. 4 uses metablocks, a group of four data units would be assigned to a metapage that extends across all four dies and the assignment of individual data units to dies would be predetermined (e.g. striped as shown). The location at which each data unit is stored is a simple function of its number so that such a scheme is easy to implement. The scheme also provides maximum parallelism by always writing across all dies. This not only ensures maximum parallelism when writing, it also ensures maximum parallelism when the data is later read. However, this scheme is not ideal for all situations.

In many memory systems, the memory array is not just used to store host data. The memory controller may store other data in the memory array. For example, certain data that is used by the memory controller for operation of the memory system may be stored in one or more dies. Such system control data may include information used to keep track of the location and the nature of host data that is stored by the controller, for example, File Allocation Table (FAT) data, directory data, and logical-to-physical address translation data. Data regarding characteristics of the memory system may also be stored by the controller, e.g. bad block lists, memory access parameters, and hot counts. The type of controller data stored in memory dies depends on the particular memory system. The controller may need to access a memory die to read or write such data at any time, for example, during a host write. Furthermore, a memory controller may perform various operations that involve host data that is stored in a memory die. For example, garbage collection operations may include copying valid data from some blocks so that the blocks can be erased and made available for new data. Particularly when the memory is relatively full, it may be necessary to perform garbage collection operations during host writes in order to accommodate the new data being received. Controller access operations, whether they are directed to system control data or host data, may have an impact on writing host data.

Figure 5:
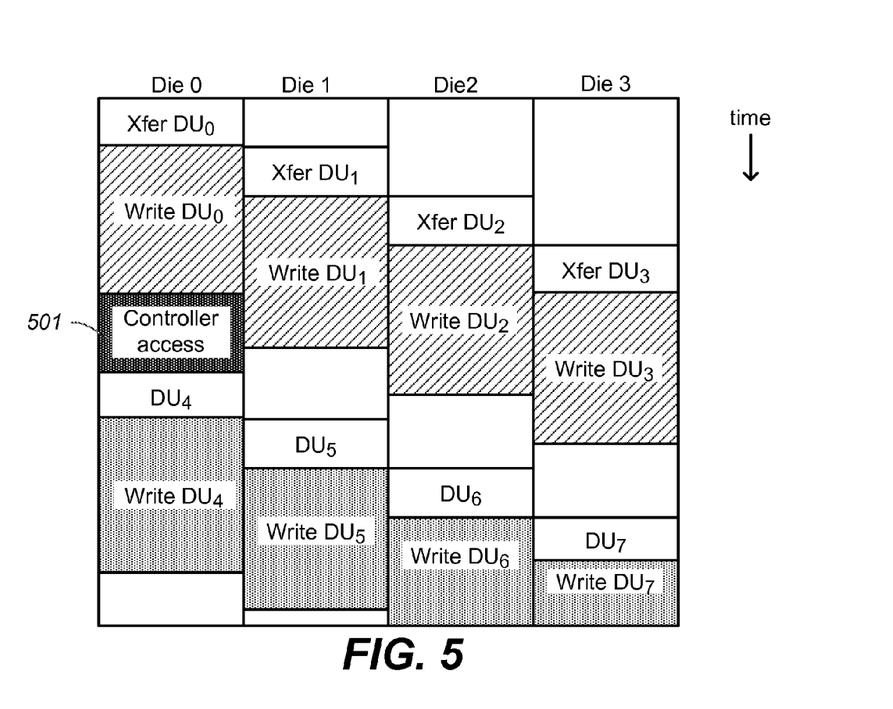
FIG. 5 shows an example of timing of write operations across four dies using deterministic assignment of data to dies.

FIG. 5 shows an example in which data units are transferred and written in a deterministic pattern as described above. $DU_0$ is first transferred ("Xfer $DU_0$") and then written ("Write $DU_0$"). During transfer of any data, such as $DU_0$, the memory bus is busy. Once the transfer is complete and writing begins, the memory bus is available for a subsequent transfer. Thus, transfer of $DU_1$ ("Xfer $DU_1$") begins as soon as transfer of $DU_0$ ends. Similarly, transfer of subsequent data units begins after the prior transfer ends so that write operations may occur in multiple dies in parallel. For a period of time all dies are busy. Then, die 0 completes writing $DU_0$. However, a controller access to die 0, 501, occurs at this time. The controller may need to write data for example. In other examples, a controller may copy data, perform a scan, a control table read, or update, or some other operation that requires access to a memory die. Thus, die 0 remains busy and unavailable for storage of host data. Because the next die in the cyclic pattern, die 0, is busy, programming of host data is delayed until it becomes available at the end of the controller access. Subsequently, transfer and writing of data recommences as before, with the same assignment of data to dies, just delayed by the time taken for the controller access 501.

According to a multi-die write management method, data received from a host may be assigned to memory dies in a manner that is not simply deterministic, but instead assigns data on the basis of die availability. When the next die in cyclic order is busy, the assignment scheme adapts by skipping the busy die and proceeds to the next die. Thus, time lost because of controller access may be significantly reduced because while the controller is accessing a given die, host data continues to be transferred to, and written in, other dies. Examples of such techniques are described in U.S. patent application Ser. No. 14/094,550, entitled "Multi-Die Write Management," filed on Dec. 2, 2013, which is hereby incorporated by reference in its entirety.

Figure 6:
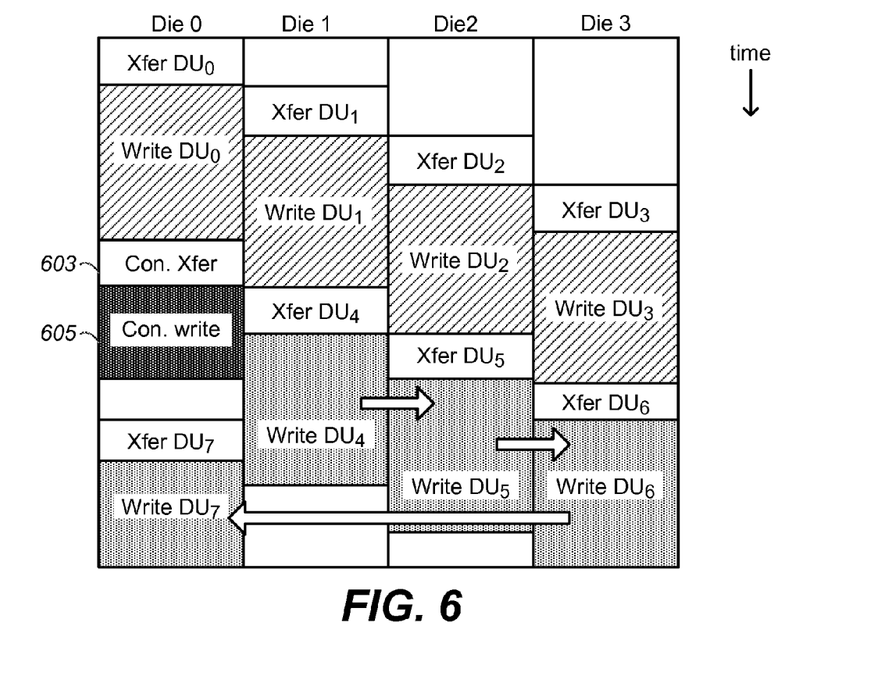
FIG. 6 shows another example of timing of write operations across four dies using adaptive assignment of data to dies.

FIG. 6 shows an example of an adaptive assignment scheme in which any busy die is skipped. $DU_0$-$DU_3$ proceed in cyclic order as before. Die 0 is then busy because the controller stores data in die 0. This access operation is shown as transfer of data from the controller to die 0 ("Con. Xfer") 603, which occupies the memory bus, followed by writing of controller data ("Con. Write") 605, which does not occupy the memory bus. In general, transfer time is much less than write time for any given data (while the vertical axis represents time in FIG. 6, operations are not intended to be to scale, i.e. vertical dimensions of boxes are not intended to represent actual times for operations). Once the controller data is transferred and the memory bus becomes available, the scheme moves to the next die in the cyclic order that is not busy. In this case, die 1 is not busy when transfer of controller data 603 ends. Therefore, the scheme assigns the next data, $DU_4$, to die 1. Subsequently, the assignment scheme proceeds in cyclic order as indicated by the arrows so that $DU_7$ is written in die 0 (because the order is cyclic, it wraps around from die 3 to die 0). Thus, in this example, assignment of data units to dies is shifted by one die. The effect of controller access is significantly reduced so that the delay is simply the time that the controller occupies the memory bus (Con. Xfer) 603, which is relatively short, and does not include the time for the controller write 605 (as in FIG. 5), which is much longer.

Figure 7:
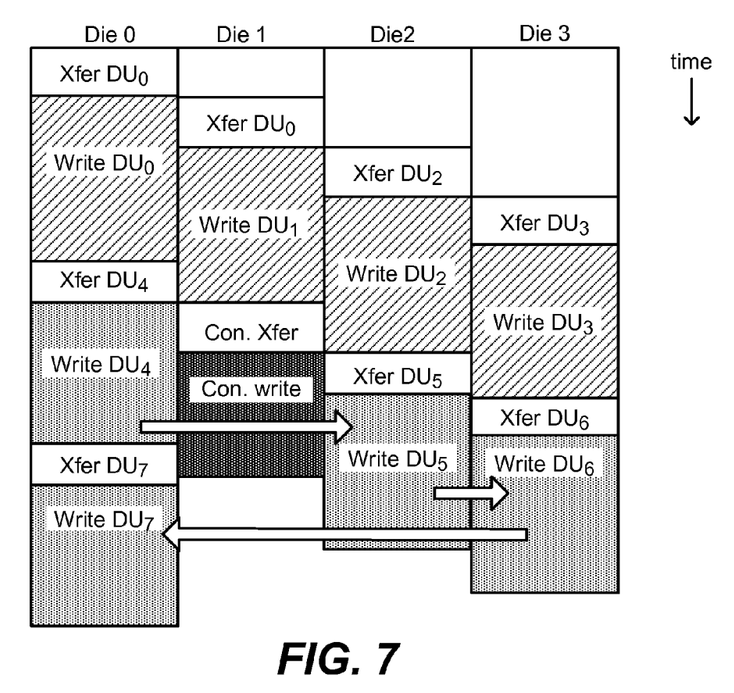
FIG. 7 shows another example of timing of write operations across four dies using adaptive assignment of data to dies.

While the example of FIG. 6 shows skipping the first die in a cyclic pattern, any die, or any group of dies, may be skipped in this manner. FIG. 7 shows an example in which $DU_4$ is transferred to die 0 and then a controller data transfer occurs to die 1 which occupies the memory bus and die 1. Subsequently, when the controller transfer ends and the memory bus is available, the scheme skips die 1, which remains busy with the controller write, and proceeds to the next ready die, die 2, Subsequently, the scheme proceeds in cyclic order to die 3 and then die 0.

Host Data Patterns

In some memory systems that use deterministic assignment of data from a host to memory dies, certain patterns in the data sent by the host may cause data to be stored in a physical arrangement that is undesirable. For example, the host may send data with some pattern that aligns with the die assignment scheme so that certain data is concentrated in one or more dies rather than being evenly distributed across all dies. This can result in uneven wear, poor access times when data is later read or updated, or other effects. Data patterns aligned with die assignment may occur with some (generally low) frequency in real applications, or may be produced in test situations so that any results from such testing show poor performance. For a given deterministic die assignment scheme it may be possible to design a test that aligns data with die assignment to produce poor performance in a particular memory.

According to an aspect of the present invention, a die assignment scheme introduces some randomness in assignment of data to dies so that assignment is not purely deterministic but instead has a random element. Randomness may be used to break up a pattern of host data so that the data is no longer aligned with memory dies. Thus, data that would align with memory dies if it was striped across dies in a deterministic fashion is randomized enough to break up the data and avoid concentrating particular data in a particular die or dies. It is not generally necessary to randomize every die assignment. Randomization may be introduced as needed, with dies being assigned in a deterministic manner between randomizing events. In some cases, non-random pattern-breaking events may be introduced, for example periodic skipping of dies (some assignment contrary to the basic scheme). For example, a simple deterministic assignment scheme may assign dies in cyclic order with a second pattern-breaking scheme operating to disrupt alignment of data to dies that may occur following the first assignment scheme (e.g. skipping dies or reversing direction periodically).

Some schemes assign dies on the basis of die availability, skipping busy dies, as described in U.S. patent application Ser. No. 14/094,550. While this may break up such a pattern when a controller accesses memory dies frequently, it may not be sufficient to adequately break up patterns and ensure good performance. In particular, controller access may not be frequent enough, so a pattern may be established over a sufficient number of blocks to cause some performance impact. Aspects of the present invention may be combined with a scheme that assigns dies on the basis of die availability (as in FIGS. 6 and 7), or may be combined with a scheme that uses a simple striping scheme (as in FIG. 5), or may be combined with any other suitable scheme (i.e. between randomization events, some other non-random scheme may be applied).

Figure 8:
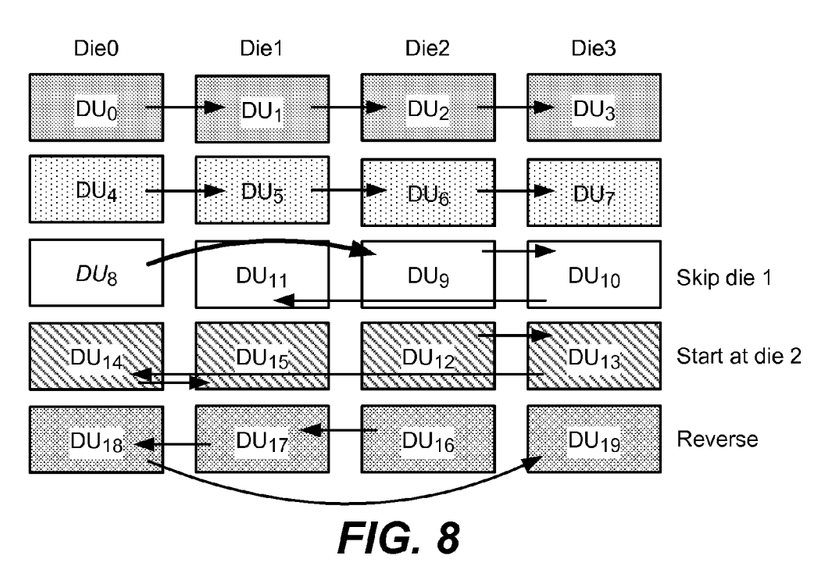
FIG. 8 shows examples of randomization of die assignment.

FIG. 8 shows an example of data from a host that is assigned using an assignment that includes randomization. Initially, data units $DU_0$-$DU_7$ are received and are striped across dies, with each new data unit being written to the next ready die in a cyclic pattern. Subsequently, after $DU_8$ is written, randomization is introduced. Instead of assigning the next data unit received from the host, $DU_9$, to die 1, the assignment scheme skips die 1 and writes $DU_9$ to die 2 instead. Subsequently, the assignment scheme returns to cyclic assignment by writing die 3 and then wrapping around to write die 1 (die 0 being still busy). Thus, the alignment of data to dies is broken. Subsequent writes may continue in cyclic order but with an offset introduced by the skipping of die 1. Thus, after $DU_{11}$ is written to die 1, the next write ($DU_{12}$) is directed to die 2, then die 3, then die 1, and so on. Thus, any pattern in the data is offset as a result of a random skipping of a die. More than one die may be skipped in this manner to offset the pattern by a different amount. A random number generator, pseudo-random number generator, or other random input may be used to trigger a die skip and/or to determine a number of dies skipped in any particular die skip operation. In general, a single skip simply offsets a pattern but the pattern may still align with dies so that problems may arise again (e.g. wear shifts from one die to another). Randomization may be performed with some frequency so that a data pattern that tends to align with dies is sufficiently broken up.

Randomization may be performed in any suitable manner. Skipping one or more dies as shown in FIG. 8 is merely one example. Another example is reversing the direction of a cyclic assignment pattern. For example, in FIG. 8, after $DU_{15}$ is written in die 1, $DU_{16}$ is written in die 2, then a random reversal of direction occurs so that the next written die is not die 3, but instead die 2. Thus, $DU_{16}$ is written to die 2, followed by writing $DU_{17}$ to die 1, then $DU_{18}$ to die 0, followed by wrapping around to die 3. The cyclic order changes from 0-1-2-3-0-1-2-3-0 . . . to 0-3-2-1-0-3-2-1-0. Different randomization steps may be used in the same memory as shown in FIG. 8. In some cases a single randomization step may combine different forms of randomization. For example, direction may be reversed and one or more dies may be skipped in a single randomization step.

Randomization steps may be triggered at varying intervals. Between randomization steps, assignment of data may follow a simple cyclic assignment scheme. Data assignment may follow a simple scheme for a certain time, or for a certain amount of data, and then receive a trigger for a randomization event. As long as the amount of data written between randomization events is kept relatively small there should be no significant overall alignment of a host data pattern with dies.

Skipping one or more dies may be implemented in various ways. One simple way to cause a selected die to be skipped is to ensure that the selected die remains busy for a longer time than usual. Thus, if the assignment scheme cycles around, skipping busy dies, the selected die will still be busy and the assignment scheme will skip it. For example, when writing data, a particular portion of data (that may be chosen at random) may deliberately be written in a slow manner that causes it to be skipped in a subsequent cycle (assuming there is no break in writing).

Figure 9:
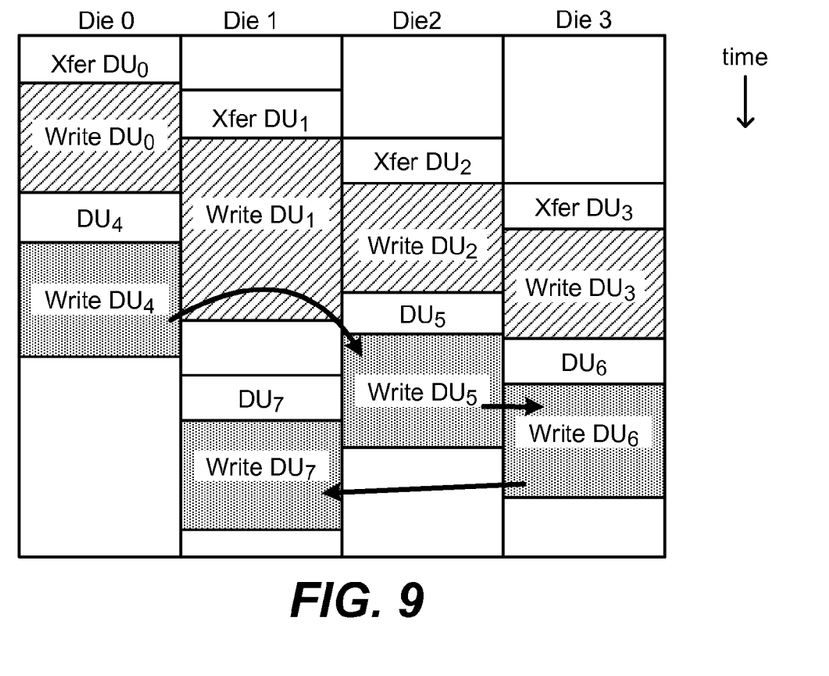
FIG. 9 shows another example of randomization of die assignment.

FIG. 9 shows an example of a slow write of $DU_1$ to die 1 which causes die 1 to be skipped. Die 1 may be randomly selected for a slow write, thus causing a skip to die 2 (which may thus be considered randomly selected as the next die). In general, it is desirable to write data as fast as possible in a memory array. However, $DU_1$ is written in a slow write mode that is longer than the normal mode used for other data and is longer than needed to program and verify the data. Thus, after $DU_4$ is transferred and $DU_5$ is to be assigned to a die, die 1 remains busy and $DU_5$ is assigned to die 2 instead. Two or more dies may be skipped in this way (i.e. slow mode may be used to cause a multi-die skip) and the number of dies skipped may be chosen at random so that the next die after such skipping is a randomly selected die.

In some cases, a slow write mode may use a special programming scheme that provides fewer errors, reduces wear, or otherwise has benefits compared with normal write mode. For example, voltage pulses used to program in slow mode may be smaller, or may be incremented by smaller amounts so that more precise control is achieved and wear is reduced.

Randomization, whether it is implemented using slow write mode or in some other way, may slow writing of host data. For example, in FIG. 9, after $DU_4$ is transferred there may be some delay before die 2 becomes ready and $DU_5$ is transferred (whereas if writing of $DU_1$ in die 1 used normal mode there might be no such delay, i.e. $DU_5$ could have been transferred to die 1 immediately, or shortly, after transfer of $DU_4$). In the case of FIG. 9, die 2 is the next die to become ready after transfer of $DU_4$. However, it may not always be the case that the randomly selected die is simply the next to become ready. Where a die assignment scheme skips busy dies, an exception to such a skipping rule may apply when a busy die is randomly selected. When the next die is randomly selected, this may override busy die skipping to force the randomly selected die as the next die. Thus, the memory may wait for the randomly selected die to become ready even though this slows host data writing. A decision as to whether to wait may be based on the amount of time left before the die is expected to be ready. If the remaining time is less than a threshold amount then the memory may wait. Thus, the randomly selected die is forced as long as the delay is acceptable.

Figure 10:
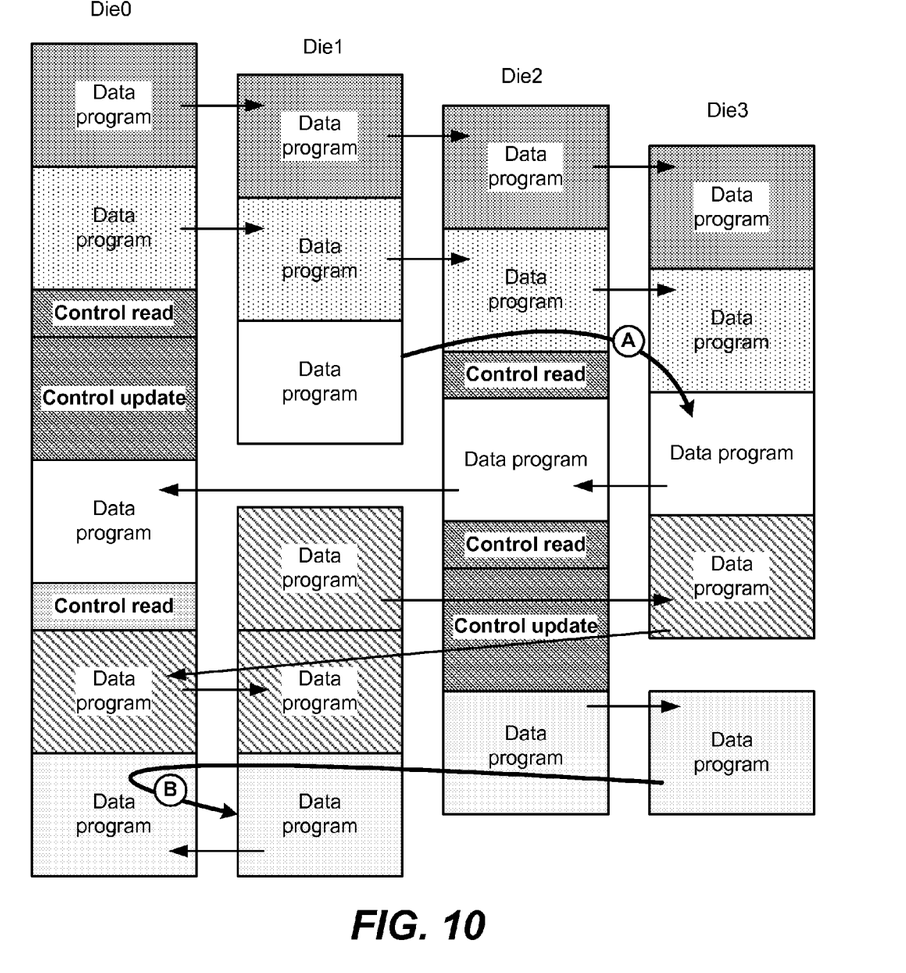
FIG. 10 illustrates randomization of die assignment and skipping busy dies.

Randomization may be introduced in any die assignment scheme including a scheme that skips busy dies (e.g. dies that are busy because of controller access). FIG. 10 shows an example of a memory in which a busy die is skipped by an assignment scheme as shown by skipping of die 2, labeled "A". FIG. 10 also shows random skipping of dies, for example, skipping die 0 and proceeding to die 2, labeled "B." In a system which skips busy dies and uses randomization, controller access may provide some pattern breaking with randomization providing additional pattern breaking. The intervals between randomization events may be adjusted depending on controller access. For example, where an interval between randomization events is set (e.g. some maximum number of cyclic writes) disruption of cyclic writes caused by controller access may restart such an interval so that the next randomization event may be deferred when a controller access occurs. In other examples, randomization events proceed without regard to controller access.

Randomization in die assignment may be provided in any suitable manner. Some examples are provided here for illustration. It will be understood that aspects of the present invention may be applied to such examples and to other randomization techniques.

Figure 11:
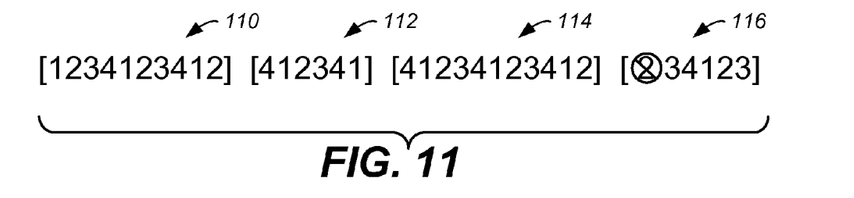
FIG. 11 shows an example of a randomization scheme

FIG. 11 shows an example of assignment in a four-die system in which cyclical assignment is maintained throughout windows that are separated by randomization events. A window size is random and the first die in a given window is random. Dies are numbered from 1-4 with a first window 110 extending for ten data units, ending with die 2. Subsequently, a second window 112 of random length (in this case, six data units) starts with a randomly chosen die (die 4). Then, a third window 114 of random length (in this case, 11 data units) starts with a randomly chosen die (die 4), followed by a fourth window 116 of random length (five data units) with a randomly chosen first die (die 2). In this case, die 2 is still busy because it was the last die of the previous window. So even though die 2 was chosen by random selection, it is skipped in this scheme. A maximum window size may be set so that any alignment between host data and dies is limited to a small number of blocks. For example, for four dies, a maximum window size of twelve or sixteen data units may be sufficient.

Figure 12:
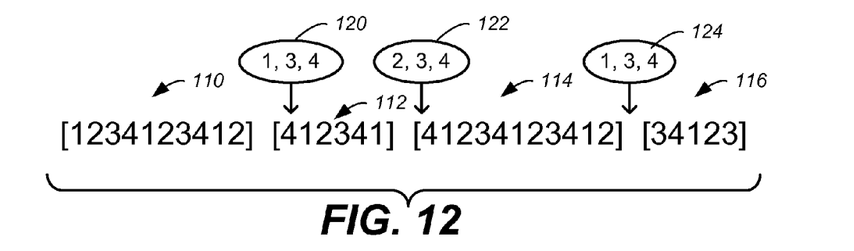
FIG. 12 illustrates another example of a randomization scheme.

FIG. 12 illustrates an example in which a starting die for a new window is selected from a pool of candidate dies that excludes the most recently used die. This may avoid having immediately sequential writes to the same die, which could impact read performance. Thus, the last die of the first window 110 is die 2. When the first die of the second window is chosen at random, it is chosen from a pool of candidate 120 dies that consists of dies 1, 3, and 4 (excluding die 2). Die 4 is chosen at random as the first die of the second window 112. Similarly, after the second window 112 (which is of random length) ends with die 1, the first die for the third window 114 is chosen from a pool 122 that excludes die 1. Similarly, after the third window ends with die 2, the first die of the fourth window 116 is chosen from a pool 124 that excludes die 2. In some cases, the last die of the prior window remains busy when choosing the first die of the next window so that it may be skipped for that reason as in FIG. 11. However, this does not guarantee that successive writes do not occur to the same die (for example, where there is a break in writing the last die of the prior window). In order to ensure that successive writes do not occur, the die may be excluded from the pool of candidate dies. Candidate dies in the pool may be ready or busy. A randomly selected die from the candidate pool may not be skipped even if it is busy in some cases (e.g. the memory may wait for such dies to become ready, at least if the delay is less than a threshold delay).

Figure 13:
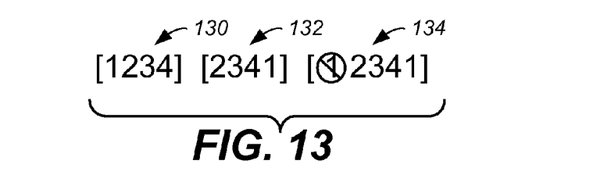
FIG. 13 illustrates an additional example of a randomization scheme.

While the examples of FIGS. 11 and 12 show randomization of window size and first die in each window, randomization may be achieved by randomizing first die selection for windows of fixed size also. FIG. 13 shows an example in which randomization occurs after every four writes. Thus, data is striped across four dies and then a randomization starts another cycle. The first window 130 starts with die 1 and ends with die 4. Then, die 2 is randomly selected as the first die of the second window 132, which ends at die 1. Then, die 1 is randomly selected as the first die of the third window 134, but it is skipped because it remains busy so that die 2 becomes the first written die of the third window.

Figure 14A:
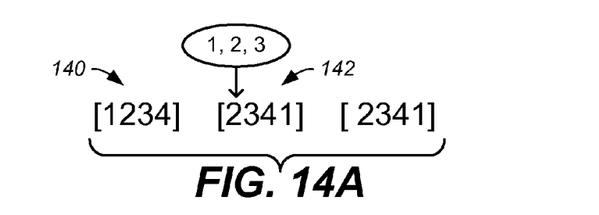
FIGS. 14A-B illustrate additional examples of randomization schemes.
Figure 14B:
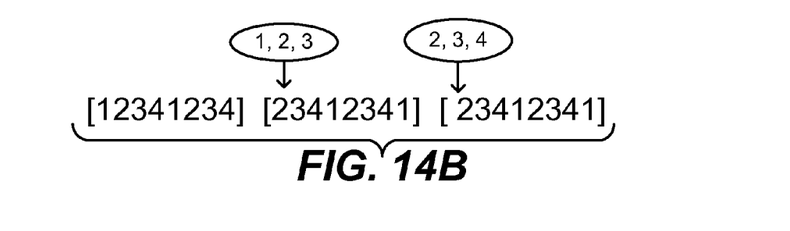

FIG. 14A shows windows of fixed size with selection of first die from a pool of candidate dies that excludes the last written die. Thus, because the first window 140 ends with die 4, the pool of candidates for random selection of the first die of the second window 142 consists of dies 1, 2, and 3 (excluding die 4). FIG. 14B shows another example of fixed length windows, with random selection from a pool that excludes the last-written die. In this case, window length is fixed at 8 writes (eight data units). It will be understood that window length may be any suitable length, and is not necessarily a multiple of the number of dies (i.e. it could be seven writes, or ten writes).

Figure 15:
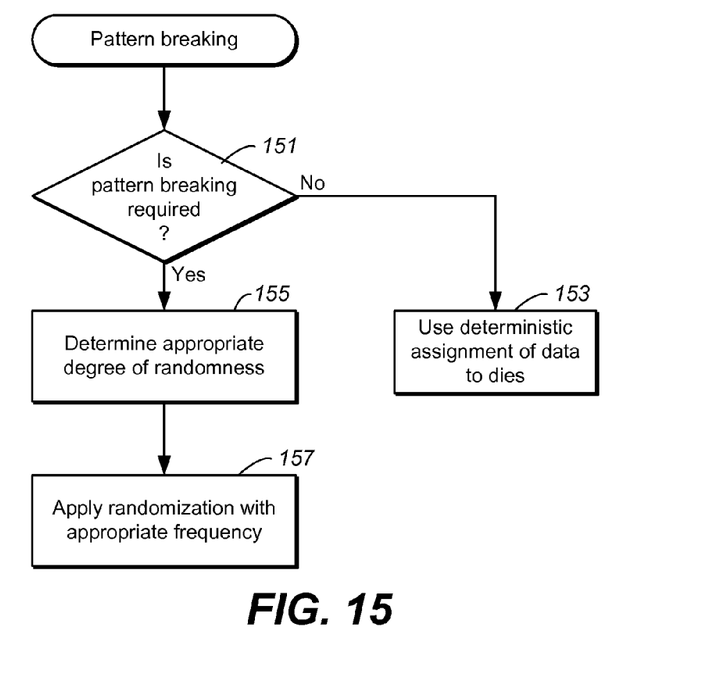
FIG. 15 illustrates management of randomization.

In some cases, there is little or no risk of host data patterns aligning with dies. For example, a host may send certain types of data that are identifiable as unlikely to align with dies. Therefore, it may be desirable to selectively apply randomization. FIG. 15 shows an example in which randomization is selectively used to provide pattern breaking and in which randomization is calibrated to the pattern breaking that is needed. A determination is made as to whether pattern breaking is required 151. This may include checking how the host is writing data and whether controller access or other effects are likely to provide sufficient pattern breaking. If it is determined that no pattern breaking is required, then a simple deterministic (non-random) assignment scheme may be used 153. If pattern breaking is required, then the appropriate degree of randomization may be determined 155. In general, a deterministic striping of data across dies is fast and simple. Adding randomization may reduce write speed. An appropriate degree of randomization may be applied 157 based on balancing write speed and the benefits of randomization (i.e. some impact on write speed may be acceptable if it provides benefits). Increased randomization may mean more frequent randomization events (smaller windows between such events). Randomization events (or other pattern-breaking events) may include die skipping, direction reversal, or other events that disrupt a deterministic assignment pattern.

Figure 16:
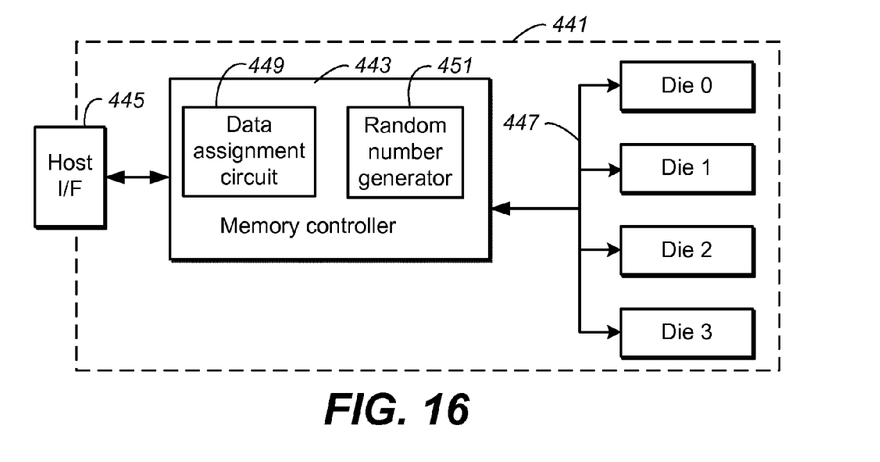
FIG. 16 shows hardware that may be used to implement aspects of the present invention.

FIG. 16 shows an example of hardware that may be used to implement aspects of the present invention. A memory system 441 includes a memory controller 443 that is in communication with a host through a host interface 445. The memory controller 443 is in communication with four memory dies (die 0-die 3) through a memory bus 447. While only one such bus is shown for clarity, it will be understood that a memory controller may have multiple memory busses, each with multiple memory dies. The memory controller 443 includes a data assignment circuit 449 that assigns data to dies in a manner that includes at least some randomization. In particular, the data assignment circuit 449 skips dies, and/or reverses direction, at random intervals. A random number generator 451 provides an input to the data assignment circuit 449 to trigger randomization events and/or to provide random input for random events (e.g. number of dies to skip). In some cases a pattern-breaking circuit (e.g. in the memory controller) may be configured to disrupt alignment of data.

While aspects of the present invention are illustrated by the above examples, it will be understood that the examples are just that—examples—and are not intended to show every possible embodiment. For example, while the above examples show four dies per memory bus, different numbers of dies may be provided. In some examples, there may be 8, 16, or more dies on a memory bus. Some number of such dies (e.g. 4) may be active at any given time with remaining dies being inactive. Also, while the present illustrations show a cyclic pattern 0, 1, 2, 3, 0, 1 . . . and so on, a cycle may begin with any die (not necessarily die 0) and may proceed in any order from die to die (not necessarily in increasing die number). While a controller write is shown as an example of a controller access operation in man of the above examples, any controller access operation may similarly affect writing of host data.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of operating a nonvolatile memory system that includes a plurality of three dimensional nonvolatile memory dies each formed having multiple physical layers of memory cells disposed above a substrate, comprising:
   sending units of data from a memory controller, over a memory bus that connects the memory controller to the plurality of three dimensional nonvolatile memory dies, in a cyclic addressing pattern;
   in response to determining that the three dimensional nonvolatile memory die that is next in the cyclic addressing pattern to the last addressed three dimensional nonvolatile memory die is busy, skipping the three dimensional nonvolatile memory die that is next in the cyclic addressing pattern and addressing a subsequent three dimensional nonvolatile memory die in the cyclic addressing pattern that is ready; and
   in response to pattern-breaking being triggered, addressing a three dimensional nonvolatile memory die that is randomly selected from a plurality of candidate three dimensional nonvolatile memory dies.

2. The method of claim 1 wherein the last addressed three dimensional nonvolatile memory die is excluded from the plurality of candidate three dimensional nonvolatile memory dies for random selection.

3. The method of claim 1 wherein one or more busy three dimensional nonvolatile memory dies are included in the plurality of candidate three dimensional nonvolatile memory dies for random selection.

4. The method of claim 3 wherein inclusion of the one or more busy three dimensional nonvolatile memory dies is in response to a determination that delay from waiting for the one or more busy three dimensional nonvolatile memory dies to be ready is within a predetermined limit.

5. The method of claim 1 wherein pattern-breaking is triggered by a determination that there is a high risk of an undesirable data pattern being established in one or more of the plurality of three dimensional nonvolatile memory dies.

6. The method of claim 1 further comprising, in response to pattern-breaking being triggered reversing an order of the cyclic addressing pattern.

7. The method of claim 1 wherein the three dimensional nonvolatile memory die that is randomly selected is a first addressed die of a cycle of the cyclical pattern.

8. The method of claim 7 wherein the cyclical pattern continues from the randomly selected die for a random number of dies after which another cycle is started at another randomly selected die.

9. The method of claim 1 wherein pattern-breaking provides slower write speed than assigning in the cyclic addressing pattern.

10. A nonvolatile memory system comprising:
a plurality of three dimensional nonvolatile memory dies each formed having multiple physical layers of memory cells disposed above a substrate;
a memory controller;
a data assignment circuit in the memory controller that is configured to assign units of data for storage in the plurality of three dimensional nonvolatile memory dies in a deterministic cyclical manner that skips busy dies; and
a pattern-breaking circuit in the memory controller that is configured to disrupt alignment of data to three dimensional nonvolatile memory dies according to the deterministic cyclical manner by randomizing assignment of units of data when pattern-breaking is triggered.

11. The nonvolatile memory system of claim 10 further comprising:
a random number generator that generates a random input to the pattern-breaking circuit.

12. The nonvolatile memory system of claim 11 further comprising:
a programming circuit that has a normal programming mode and a slow programming mode, the random input provided to the programming circuit to randomly identify a three dimensional nonvolatile memory die for programming in a slow programming mode.

13. The nonvolatile memory system of claim 11 wherein the pattern-breaking circuit is configured to randomly select a next addressed three dimensional nonvolatile memory die from a plurality of candidate three dimensional nonvolatile memory dies that excludes the last addressed three dimensional nonvolatile memory die.

14. The nonvolatile memory system of claim 13 wherein one or more busy three dimensional nonvolatile memory dies are included in the plurality of candidate three dimensional nonvolatile memory dies for random selection.

15. The nonvolatile memory system of claim 14 wherein the one or more busy three dimensional nonvolatile memory dies are included in the plurality of candidate three dimensional nonvolatile memory dies only if they are expected to be ready within a predetermined time.

16. The nonvolatile memory system of claim 11 wherein pattern-breaking is triggered by a determination that there is a high risk of an undesirable data pattern being established in the plurality of three dimensional nonvolatile memory dies.

17. The nonvolatile memory system of claim 11 wherein the pattern-breaking circuit is configured to reverse an order of the cyclic addressing pattern.

18. The three dimensional nonvolatile memory system of claim 11 wherein the plurality of three dimensional nonvolatile memory dies consists of four three dimensional nonvolatile dies.

19. The three dimensional nonvolatile memory system of claim 11 further comprising a memory bus that connects the plurality of three dimensional nonvolatile memory dies to the memory controller.

20. A method of operating a nonvolatile memory system that includes a plurality of three dimensional nonvolatile memory dies each formed having multiple physical layers of memory cells disposed above a substrate, comprising:
sending units of data from a memory controller, over a memory bus that connects the memory controller to the plurality of three dimensional nonvolatile memory dies, in a cyclic addressing pattern, until a three dimensional nonvolatile memory die that is next in the cyclic addressing pattern to a last addressed three dimensional nonvolatile memory die is busy, or pattern-breaking is triggered;
in response to determining that the three dimensional nonvolatile memory die that is next in the cyclic addressing pattern to the last addressed three dimensional nonvolatile memory die is busy, skipping the three dimensional nonvolatile memory die that is next in the cyclic addressing pattern and addressing a subsequent three dimensional nonvolatile memory die in the cyclic addressing pattern that is ready;
determining if there is a high risk of an undesirable data pattern being established in the plurality of three dimensional nonvolatile memory dies;
in response to determining that there is a high risk of an undesirable data pattern being established in the plurality of three dimensional nonvolatile memory dies, triggering pattern-breaking; and
in response to pattern-breaking being triggered, addressing a three dimensional nonvolatile memory die that is randomly selected from a plurality of candidate three dimensional nonvolatile memory dies, the plurality of candidate three dimensional nonvolatile memory dies including one or more busy three dimensional nonvolatile memory dies that are expected to be ready within a predetermined time.

21. A nonvolatile memory system comprising:
a plurality of three dimensional nonvolatile memory dies each formed having multiple physical layers of memory cells disposed above a substrate;
a memory controller;
a data bus connecting the plurality of three dimensional nonvolatile memory dies to the data bus;
a data assignment circuit in the memory controller, the data assignment circuit configured to assign units of data for storage in the plurality of three dimensional nonvolatile memory dies in a deterministic cyclical manner that skips busy dies; and
a pattern-breaking circuit in the memory controller that, when triggered by a determination that there is a high risk of an undesirable data pattern being established by assignment in the deterministic cyclical manner, is configured to disrupt alignment of data to three dimensional nonvolatile memory dies according to the deterministic cyclical manner by randomly selecting a next addressed three dimensional nonvolatile memory die from a plurality of candidate three dimensional nonvolatile memory dies, the plurality of candidate three dimensional nonvolatile memory dies including one or more busy three dimensional nonvolatile memory dies that are expected to be ready within a predetermined time.

\* \* \* \* \*